(12) United States Patent
Yang

(10) Patent No.: US 11,114,937 B2
(45) Date of Patent: Sep. 7, 2021

(54) CHARGE PUMP CIRCUIT

(71) Applicant: SHANGHAI HUAHONG GRACE SEMICONDUCTOR MANUFACTURING CORPORATION, Shanghai (CN)

(72) Inventor: Guangjun Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/909,215

(22) Filed: Jun. 23, 2020

(65) Prior Publication Data
US 2021/0067034 A1    Mar. 4, 2021

(30) Foreign Application Priority Data

Sep. 2, 2019   (CN) .......................... 201910821840.7

(51) Int. Cl.
*H02M 3/07*   (2006.01)
*G11C 5/14*   (2006.01)

(52) U.S. Cl.
CPC ............. *H02M 3/073* (2013.01); *G11C 5/145* (2013.01); *H02M 3/071* (2021.05)

(58) Field of Classification Search
CPC .. H02M 3/073; H02M 2003/071; H02M 3/07; H02M 2003/075; H02M 2003/072; H02M 2003/076; H02M 2003/077; G11C 5/145
See application file for complete search history.

(56) References Cited

U.S. PATENT DOCUMENTS

| 6,466,079 | B1 | 10/2002 | Kushnarenko |
| 8,779,845 | B2 * | 7/2014 | Kim .......................... H03L 5/00 327/536 |
| 2008/0130329 | A1 | 6/2008 | Lee |

FOREIGN PATENT DOCUMENTS

| CN | 1477773 A | 2/2004 |
| CN | 1049091614 A | 10/2014 |
| CN | 104714589 A | 6/2015 |

OTHER PUBLICATIONS

Search Report issued in corresponding Chinese Patent Application No. 2019108218407, dated Apr. 1, 2020, 3 Pages.

* cited by examiner

*Primary Examiner* — Jung Kim
(74) *Attorney, Agent, or Firm* — MKG, LLC

(57) ABSTRACT

A charge pump unit structure of a charge pump circuit includes a booster circuit unit, a positive pump transfer unit and a negative pump transfer unit. An output terminal of the booster circuit unit is connected to an input terminal of the positive pump transfer unit through a first switch circuit and to an input terminal of the negative pump transfer unit through a second switch circuit. An erase enable signal is connected to control terminals of the positive and negative pump transfer units. A first enable signal is connected to control terminals of the positive pump transfer unit and the first switch circuit. A second enable signal is connected to control terminals of the negative pump transfer unit and the second switch circuit.

15 Claims, 4 Drawing Sheets

CHARGE PUMP CIRCUIT

CROSS-REFERENCES TO RELATED APPLICATIONS

This application claims priority to Chinese patent application No. CN201910821840.7 filed on Sep. 2, 2019, and entitled "CHARGE PUMP CIRCUIT", the disclosure of which is incorporated herein by reference in entirety.

TECHNICAL FIELD

The disclosure relates to a semiconductor integrated circuit, in particular to a charge pump circuit.

BACKGROUND

With the development of semiconductor technology, working voltages of devices is getting lower and lower. Regarding a memory, the power supply voltage required for operation thereof decreases to below 2.5V or 1.8V. However, the programming and erasing voltages of the memory would be much larger than the power supply voltage, so that a charge pump circuit is usually required to convert the power supply voltage to the required programming or erasing voltage. In integrated circuits, both positive and negative voltages are usually used. Referring to FIG. 1, it is a structural diagram of one charge pump unit of an existing charge pump circuit; the charge pump unit structure 101 of the existing charge pump circuit includes: 2 booster circuit units, as indicated by labels 102a and 102b, respectively; and the positive pump transfer unit 103 and the negative pump transfer unit 104.

The control terminal of the positive pump transfer unit 103 is connected to an erase enable signal Erasen; and the control terminal of the negative pump transfer unit 104 is connected to the erase enable signal Erasen.

When the erase enable signal Erasen is enabled, the charge pump circuit outputs both a positive voltage signal and a negative voltage signal.

During the enabling process of the erase enable signal Erasen, the boosting circuit unit 102a provides a boosting signal Vbst to the positive pump transfer unit 103 and the boosting circuit unit 102a and the positive pump transfer unit 103 constitutes a positive voltage charge pump unit, and the positive voltage charge pump unit operates and outputs a unit positive voltage signal Vpos from the output terminal of the positive pump transfer unit 103.

Meanwhile, during the enabling process of the erase enable signal Erasen, the booster circuit unit 102b provides a booster signal Vbst to the negative pump transfer unit 104 and the booster circuit unit 102b and the negative pump transfer unit 104 constitutes a negative voltage charge pump unit, and the negative voltage charge pump unit operates and outputs a unit negative voltage signal Vneg from the output terminal of the negative pump transfer unit 104.

The charge pump circuit is formed by the charge pump unit structure 101 connected in multiple stages in series.

In the first-stage charge pump unit structure 101, the input terminal of the positive voltage charge pump unit is connected to a power supply voltage, and the unit positive voltage signal output by the positive voltage charge pump unit of the charge pump unit structure 101 of each stage is increased stage by stage and the positive voltage signal is outputted at the positive voltage charge pump unit of the charge pump unit structure 101 of the last stage.

In the charge pump unit structure 101 of the first stage, the input terminal of the negative voltage charge pump unit is grounded, and the unit negative voltage signal output by the negative voltage charge pump unit of the charge pump unit structure 101 of each stage is decreased stage by stage and the negative voltage signal is outputted at the negative voltage charge pump unit of the charge pump unit structure 101 of the last stage.

Referring to FIG. 2, it is the output signal curve of the charge pump unit of the existing charge pump circuit shown in FIG. 1; curve ERASEN in FIG. 2 corresponds to the erase enable signal Erasen; and curve VNEG corresponds to the curve of the unit negative voltage signal Vneg, and curve VPOS corresponds to the curve of the unit positive voltage signal Vpos. It can be seen that when the erase enable signal Erasen is at a high level and finally the required unit positive voltage signal Vpos and the unit negative voltage signal Vneg are formed, the obtained unit negative voltage signal Vneg is −7V, and the unit positive voltage signal Vpos is 8V, as shown in FIG. 2.

In integrated circuits, the smaller the area of the circuit is, the higher the integration of the chip is and the lower the cost is, so reducing the circuit area on the basis of the existing charge pump circuit is the concern of the applicant.

BRIEF SUMMARY

The technical problem to be solved by the present disclosure is to provide a charge pump circuit, which can reduce a circuit area.

To solve the above technical problem, the charge pump unit structure of the charge pump circuit provided by the present disclosure includes: a booster circuit unit, a positive pump transfer unit and a negative pump transfer unit.

The output terminal of the booster circuit unit is connected to the input terminal of the positive pump transfer unit through a first switch circuit.

The output terminal of the booster circuit unit is connected to the input terminal of the negative pump transfer unit through a second switch circuit.

The control end of the positive pump transfer unit is connected to an erase enable signal and a first enable signal; and the control end of the negative pump transfer unit is connected to the erase enable signal and a second enable signal, and the second enable signal is an inverted signal of the first enable signal.

The control terminal of the first switch circuit is connected to the first enable signal, and the control terminal of the second switch circuit is connected to the second enable signal.

When the erase enable signal is enabled, the charge pump circuit outputs both a positive voltage signal and a negative voltage signal.

During the enabling process of the erase enable signal, when the first enable signal is enabled, the first switch circuit is conducted, the second switch circuit is switched off, the positive pump transfer unit works, the negative pump transfer unit stops working, the booster circuit unit provides a boost signal to the positive pump transfer unit and the positive voltage charge pump unit is composed of the booster circuit unit and the positive pump transfer unit, and the positive voltage charge pump unit works and outputs a unit positive voltage signal from the output terminal of the positive pump transfer unit.

During the enabling process of the erase enable signal, when the second enable signal is enabled, the second switch circuit is conducted, the first switch circuit is switched off, the negative pump transfer unit works, the positive pump transfer unit stops working, the booster circuit unit provides a boost signal to the negative pump transfer unit, and the negative voltage charge pump unit is composed of the booster circuit unit and the negative pump transfer unit, and the negative voltage charge pump unit works and outputs a unit negative voltage signal from the output terminal of the negative pump transfer unit.

A further improvement is that the frequency of the first enable signal is greater than the frequency of the erase enable signal, and during the enabling process of the erase enable signal, the positive voltage charge pump unit and the negative voltage charge pump unit work alternately so that the charge pump circuit outputs both a positive voltage signal and a negative voltage signal.

A further improvement is that the erase enable signal is enabled when it is at a high level; or, the erase enable signal is enabled when it is at a low level.

A further improvement is that the first enable signal is enabled when it is at a high level, and the second enable signal is enabled when it is at a high level; or, the first enable signal is enabled when it is at a low level, and the second enable signal is enabled when it is at a low level.

A further improvement is that the booster circuit unit includes an inverter and a capacitor circuit.

The input terminal of the inverter is connected to an input clock signal, the output terminal of the inverter is connected to the input terminal of the capacitor circuit, and the output terminal of the capacitor circuit serves as the output terminal of the booster circuit unit and outputs the boost signal.

A further improvement is that the inverter is a CMOS inverter.

A further improvement is that the capacitor circuit is formed by connecting a plurality of capacitors in series or in parallel, and the capacitor of the capacitor circuit includes a MOS capacitor.

A further improvement is that the MOS capacitor is composed of an NMOS transistor with a source and a drain connected together or a PMOS transistor connected with a source and a drain connected together.

A further improvement is that the positive pump transfer unit includes a first NMOS transistor and a second NMOS transistor.

The drain of the first NMOS transistor is connected to the drain of the second NMOS transistor and connected to the first positive voltage input signal.

The gate of the first NMOS transistor is connected to the gate of the second NMOS transistor and connected to the second positive voltage input signal.

The source of the first NMOS transistor outputs a first positive voltage output signal, and the source of the second NMOS transistor outputs a second positive voltage output signal.

The output terminal of the booster circuit unit is connected to the drain of the first NMOS transistor.

A further improvement is that the positive pump transfer unit also includes a third NMOS transistor.

The source of the third NMOS transistor is connected to the drain of the first NMOS transistor, the drain of the third NMOS transistor is connected to the gate of the first NMOS transistor, and the gate of the third NMOS transistor is connected to the source of the first NMOS transistor.

A further improvement is that the negative pump transfer unit includes a fourth NMOS transistor and a fifth NMOS transistor.

The drain of the fourth NMOS transistor is connected to the drain of the fifth NMOS transistor and outputs a first negative voltage output signal.

The gate of the fourth NMOS transistor is connected to the gate of the fifth NMOS transistor and connected to the second negative voltage output signal.

The source of the fourth NMOS transistor is connected to the first negative voltage input signal, and the source of the fifth NMOS transistor is connected to the second negative voltage input signal.

The output terminal of the boosting circuit unit is connected to the drain of the fourth NMOS transistor.

A further improvement is that the negative pump transfer unit also includes a sixth NMOS transistor.

The source of the sixth NMOS transistor is connected to the gate of the fourth NMOS transistor, the drain of the sixth NMOS transistor is connected to the drain of the fourth NMOS transistor, and the gate of the sixth NMOS transistor is connected to the source of the fourth NMOS transistor.

A further improvement is that the first switch circuit includes more than one NMOS transistor or PMOS transistor connected in series The second switch circuit includes more than one NMOS transistor or PMOS transistor connected in series.

A further improvement is that the charge pump circuit is formed by connecting the charge pump unit structure in multiple stages in series.

A further improvement is that, in the charge pump unit structure of the first stage, the input terminal of the positive voltage charge pump unit is connected to a power supply voltage, the unit positive voltage signal output by the positive voltage charge pump unit of the charge pump unit structure of each stage increases stage by stage and the positive voltage signal is outputted at the positive voltage charge pump unit of the charge pump unit structure of the last stage.

In the charge pump unit structure of the first stage, the input terminal of the negative voltage charge pump unit is grounded, the unit negative voltage signal output by the negative voltage charge pump unit of the charge pump unit structure of each stage decreases stage by stage and the negative voltage signal is outputted at the negative voltage charge pump unit of the charge pump unit structure of the last stage.

The charge pump unit structure of the charge pump circuit of the present disclosure includes both a positive pump transfer unit and a negative pump transfer unit, and the positive pump transfer unit and the negative pump transfer unit can share a booster circuit unit and respectively output the unit positive voltage signal and negative voltage signal, finally achieving the output of positive and negative voltage signals. Hence, the present disclosure can realize that only a booster circuit unit is used for each charge pump unit structure when the output of positive and negative voltage signals is realized, and compared with the existing circuit, the present disclosure can reduce one booster circuit unit, thereby reducing the circuit area, and thus improving the chip integration and reducing the chip cost.

BRIEF DESCRIPTION OF THE DRAWINGS

The present disclosure will be further illustrated in detail below with reference to the drawings and detailed description.

DETAILED DESCRIPTION OF THE DISCLOSURE

Figure 1:
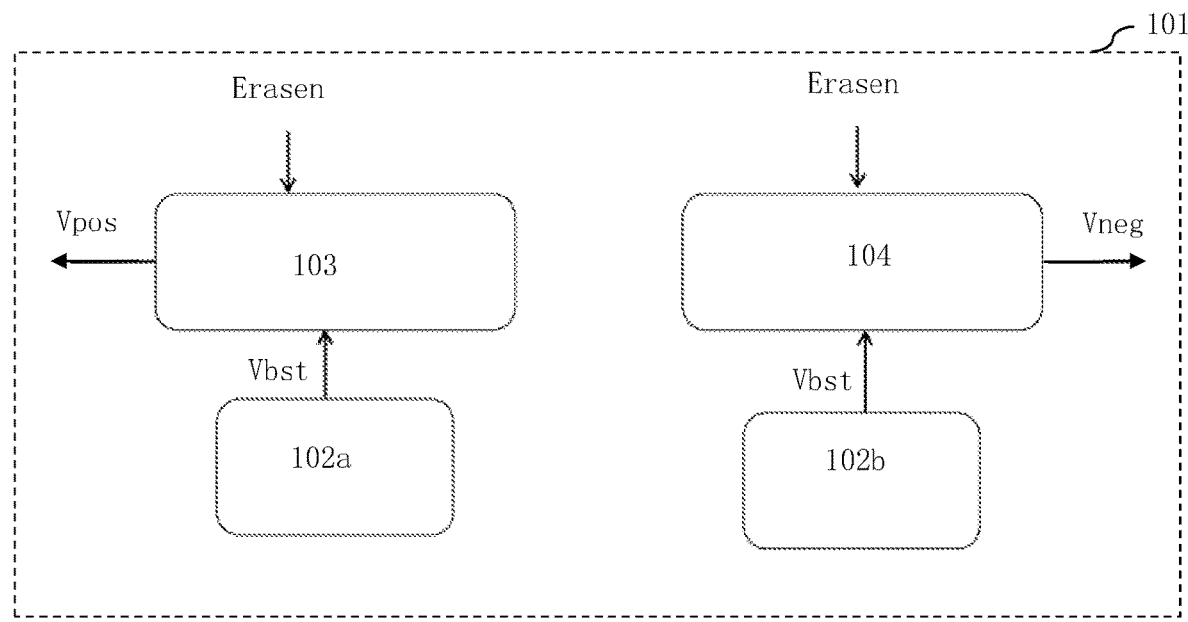
FIG. 1 is a structural diagram of a charge pump unit of an existing charge pump circuit.
Figure 2:
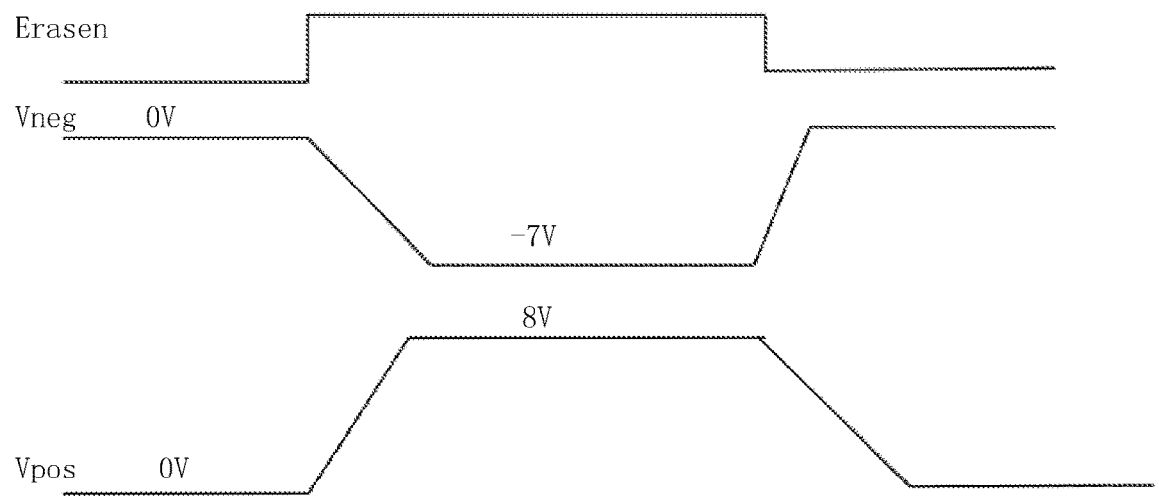
FIG. 2 is an output signal curve of the charge pump unit of the existing charge pump circuit shown in FIG. 1.
Figure 3:
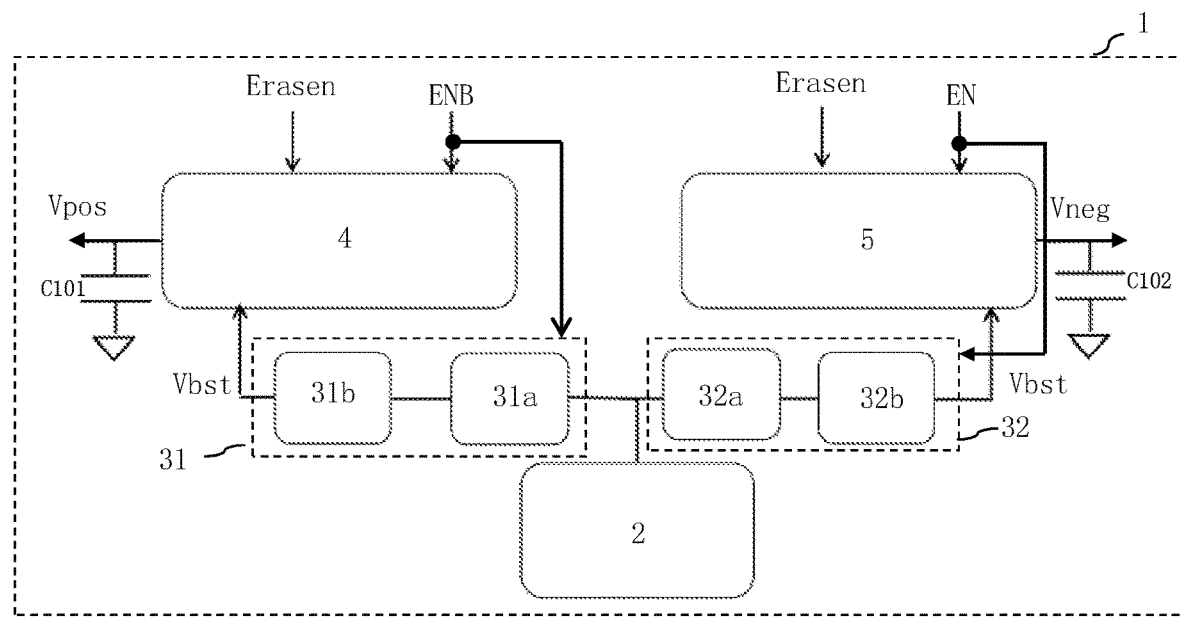
FIG. 3 is a structural diagram of a charge pump unit of a charge pump circuit according to an embodiment of the present disclosure.

Referring to FIG. 3, it is a structural diagram of a charge pump unit of a charge pump circuit according to an embodiment of the present disclosure; the charge pump unit structure of the charge pump circuit 1 according to an embodiment of the present disclosure includes: a booster circuit unit 2, a positive pump transfer unit 4 and a negative pump transfer unit 5.

The output terminal of the booster circuit unit 2 is connected to the input terminal of the positive pump transfer unit 4 through a first switch circuit 31.

The output terminal of the booster circuit unit 2 is connected to the input terminal of the negative pump transfer unit 5 through a second switch circuit 32.

According to one embodiment, the first switch circuit 31 includes more than one NMOS transistor or PMOS transistor connected together in series. FIG. 3 shows that the first switch circuit 31 is formed by connecting switches 31a and 31b in series. The second switch circuit 32 includes more than one NMOS transistor or PMOS transistor connected together in series. FIG. 3 shows that the second switch circuit 32 is formed by connecting switches 32a and 32b in series.

The control terminal of the positive pump transfer unit 4 is connected to an erase enable signal Erasen and a first enable signal ENB; the control terminal of the negative pump transfer unit 5 is connected to the erase enable signal Erasen and a second enable signal EN, and the second enable signal EN is an inverted signal of the first enable signal ENB.

The control terminal of the first switch circuit 31 is connected to the first enable signal ENB, and the control terminal of the second switch circuit 32 is connected to the second enable signal EN.

When the erase enable signal is enabled, the charge pump circuit outputs both a positive voltage signal and a negative voltage signal.

During the enabling process of the erase enable signal Erasen, when the first enable signal ENB is enabled, the first switch circuit 31 is conducted, the second switch circuit 32 is switched off, the positive pump transfer unit 4 works, the negative pump transfer unit 5 stops working, the booster circuit unit 2 provides a boost signal Vbst to the positive pump transfer unit 4 and the positive voltage charge pump unit is composed of the booster circuit unit 2 and the positive pump transfer unit 4, and the positive voltage charge pump unit works and outputs a unit positive voltage signal Vpos from the output terminal of the positive pump transfer unit 4.

During the enabling process of the erase enable signal Erasen, when the second enable signal EN is enabled, the second switch circuit 32 is conducted, the first switch circuit 31 is switched off, the negative pump transfer unit 5 works, the positive pump transfer unit 4 stops working, the booster circuit unit 2 provides a booster signal Vbst to the negative pump transfer unit 5 and a negative voltage charge pump unit is composed of the booster circuit unit 2 and the negative pump transfer unit 5, and the negative voltage charge pump unit works and outputs a unit negative voltage signal Vneg from the output terminal of the negative pump transfer unit 5.

According to one embodiment, a capacitor C101 is also connected to the output of the positive pump transfer unit 4; and a capacitor C102 is also connected to the output terminal of the negative pump transfer unit 5.

In the embodiment of the present disclosure, the frequency of the first enable signal ENB is greater than the frequency of the erase enable signal Erasen. During the enabling process of the erase enable signal Erasen, the positive voltage charge pump unit and the negative voltage charge pump unit work alternately so that the charge pump circuit outputs both a positive voltage signal and a negative voltage signal.

In the embodiment of the present disclosure, the erase enable signal Erasen is enabled when it is at a high level. In another embodiment, the erase enable signal Erasen is enabled when it is at a low level.

The first enable signal ENB is enabled when it is at a high level, and the second enable signal EN is enabled when it is at a high level. In another embodiment, the first enable signal ENB is enabled when it is at a low level, and the second enable signal EN is enabled when it is at a high level.

The charge pump circuit is composed of the charge pump unit structure 1 connected in multiple stages in series.

In the charge pump unit structure 1 of the first stage, the input terminal of the positive voltage charge pump unit is connected to a power supply voltage, the unit positive voltage signal Vpos output by the positive voltage charge pump unit of the charge pump unit structure 1 of each stage increases stage by stage, and the positive voltage signal is outputted at the positive voltage charge pump unit of the charge pump unit structure 1 of the last stage.

In the charge pump unit structure 1 of the first stage, the input terminal of the negative voltage charge pump unit is grounded, the unit negative voltage signal Vneg output by the negative voltage charge pump unit of the charge pump unit structure 1 of each stage is decreased stage by stage, and the negative voltage signal is outputted at the negative voltage charge pump unit of the charge pump unit structure 1 of the last stage.

Figure 4:
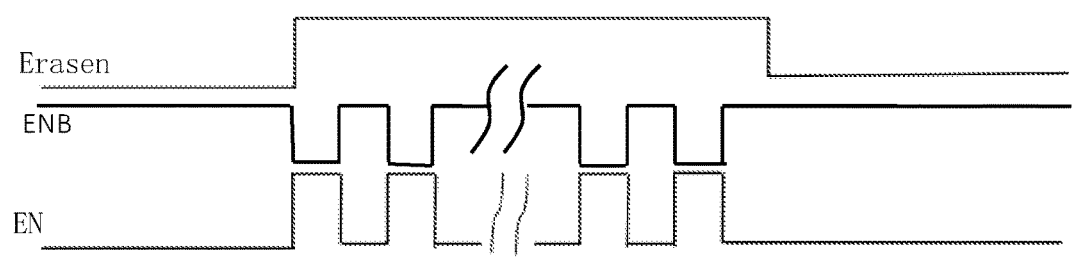
FIG. 4 is an output signal curve of the charge pump unit of the charge pump circuit shown in FIG. 3 according to an embodiment of the present disclosure.

Referring to FIG. 4, it is the output signal curve of the charge pump unit of the charge pump circuit shown in FIG. 3; the curve ERASEN in FIG. 4 corresponds to the erase enable signal Erasen; the curve EN corresponds to the second enable signal EN; the first enable signal ENB is not shown in the figure, but its curve can be obtained according to the inverted signal of the curve EN; the curve VNEG corresponds to the curve of the unit negative voltage signal Vneg, the curve VPOS corresponds to the curve of the unit positive voltage signal Vpos. It can be seen that when the erase enable signal Erasen is at a high level, the first enable signal ENB and the second enable signal EN would change, and finally the required unit positive voltage signal Vpos and the unit negative voltage signal Vneg would be formed. FIG. 4 shows that the obtained unit negative voltage signal Vneg is −7V, and the unit positive voltage signal Vpos is 8V.

Figure 7:
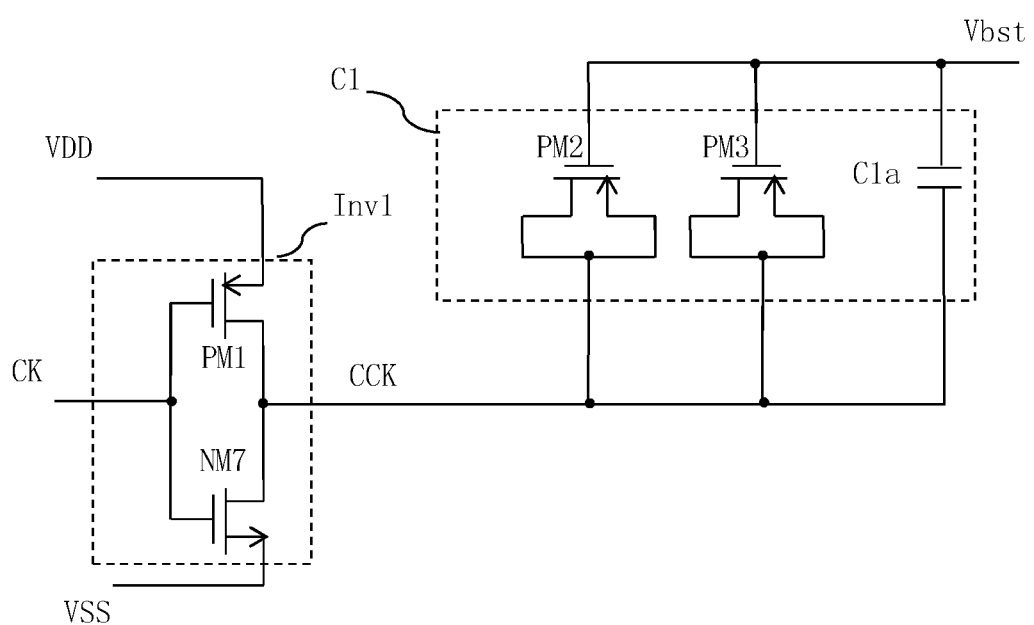
FIG. 7 is a circuit diagram of a booster circuit unit of a charge pump circuit according to an embodiment of the present disclosure.

Referring to FIG. 7, it is a circuit diagram of a booster circuit unit of a charge pump circuit according to an embodiment of the present disclosure. The booster circuit unit 2 includes an inverter Inv1 and a capacitor circuit C1.

The input terminal of the inverter Inv1 is connected to an input clock signal CK, the output terminal of the inverter Inv1 outputs a clock signal CCK, which is an inverted signal of the clock signal CK and has a stronger driving capability. The output terminal of the inverter Inv1 is connected to the input terminal of the capacitor circuit C1, and the output terminal of the capacitor circuit C1 serves as the output terminal of the booster circuit unit 2 and outputs the boosted signal Vbst.

According to one embodiment, the inverter Inv1 is a CMOS inverter, such as a CMOS inverter composed of a PMOS transistor PM1 and an NMOS transistor NM7, and the CMOS inverter is connected between the power supply voltage VDD and the ground VSS.

The capacitor circuit C1 is formed by connecting a plurality of capacitors in series or in parallel, and the capacitor of the capacitor circuit C1 includes a MOS capacitor. The MOS capacitor is composed of an NMOS transistor with a source and a drain connected together or a PMOS transistor with a source and a drain connected together. FIG. 7 shows that the capacitor circuit C1 is formed by connecting, in parallel, PMOS transistors PM2 and PM3 connected as a MOS capacitor structure and a capacitor C1a in a passive structure.

Figure 5:
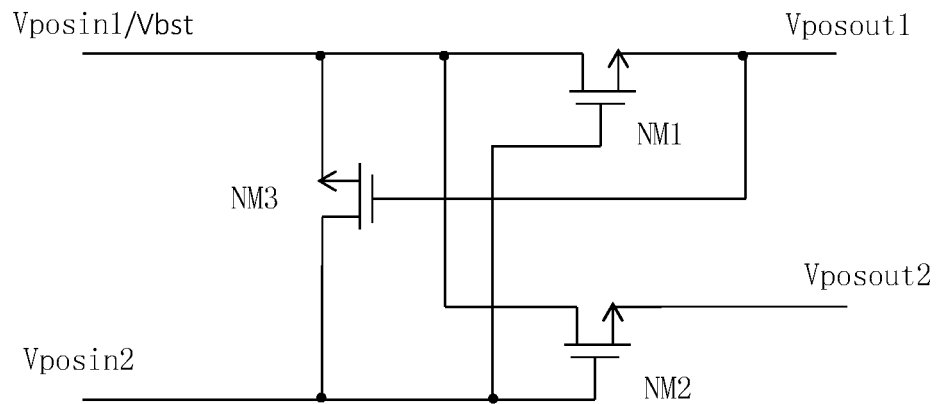
FIG. 5 is a circuit diagram of a positive pump transfer unit of a charge pump circuit according to an embodiment of the present disclosure.

Referring to FIG. 5, it is a circuit diagram of a positive pump transfer unit of a charge pump circuit according to an embodiment of the present disclosure; and the positive pump transfer unit 4 includes a first NMOS transistor NM1 and a second NMOS transistor NM2.

The drain of the first NMOS transistor NM1 is connected to the drain of the second NMOS transistor NM2 and connected to the first positive voltage input signal Vposin1.

The gate of the first NMOS transistor NM1 is connected to the gate of the second NMOS transistor NM2 and connected to the second positive voltage input signal Vposin2.

The source of the first NMOS transistor NM1 outputs a first positive voltage output signal Vposout1, and the source of the second NMOS transistor NM2 outputs a second positive voltage output signal Vposout2.

The output terminal of the booster circuit unit 2 is connected to the drain of the first NMOS transistor NM1.

According to one embodiment, the positive pump transfer unit 4 also includes a third NMOS transistor NM3.

The source of the third NMOS transistor NM3 is connected to the drain of the first NMOS transistor NM1, the drain of the third NMOS transistor NM3 is connected to the gate of the first NMOS transistor NM1, and the gate of the third NMOS transistor NM3 is connected to the source of the first NMOS transistor NM1.

Figure 6:
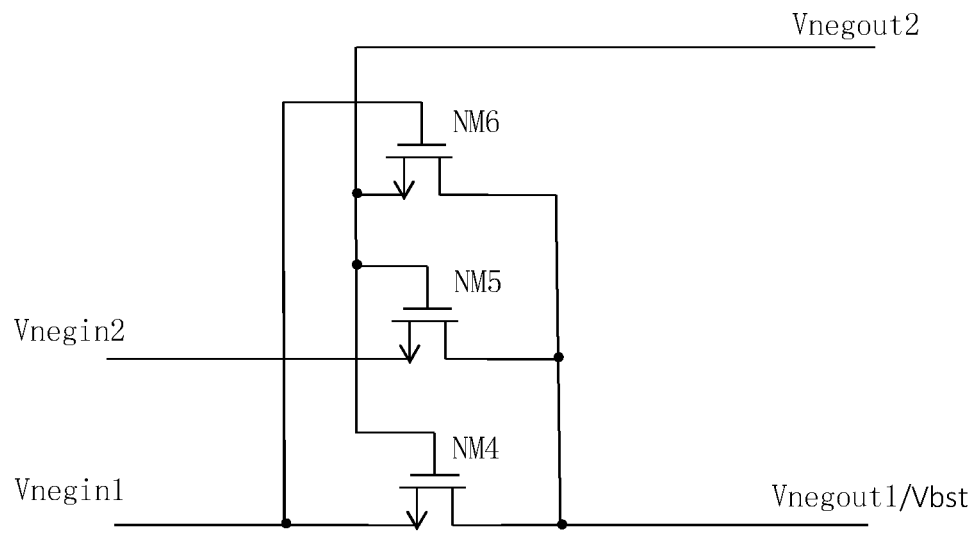
FIG. 6 is a circuit diagram of a negative pump transfer unit of a charge pump circuit according to an embodiment of the disclosure.

Referring to FIG. 6, it is a circuit diagram of a negative pump transfer unit of a charge pump circuit according to an embodiment of the present disclosure; and the negative pump transfer unit 5 includes a fourth NMOS transistor NM4 and a fifth NMOS transistor NM5.

The drain of the fourth NMOS transistor NM4 is connected to the drain of the fifth NMOS transistor NM5 and outputs a first negative voltage output signal Vnegout1.

The gate of the fourth NMOS transistor NM4 is connected to the gate of the fifth NMOS transistor NM5 and connected to the second negative voltage output signal Vnegout2.

The source of the fourth NMOS transistor NM4 is connected to the first negative voltage input signal Vnegin1, and the source of the fifth NMOS transistor NM5 is connected to the second negative voltage input signal Vnegin2.

The output terminal of the booster circuit unit 2 is connected to the drain of the fourth NMOS transistor NM4.

According to one embodiment, the negative pump transfer unit 5 also includes a sixth NMOS transistor NM6.

The source of the sixth NMOS transistor NM6 is connected to the gate of the fourth NMOS transistor NM4, the drain of the sixth NMOS transistor NM6 is connected to the drain of the fourth NMOS transistor NM4, and the gate of the sixth NMOS transistor NM6 is connected to the source of the fourth NMOS transistor NM4.

The charge pump unit structure 1 of the charge pump circuit of the embodiment of the present disclosure includes both a positive pump transfer unit 4 and a negative pump transfer unit 5, and the positive pump transfer unit 4 and the negative pump transfer unit 5 may share a booster circuit unit 2 and output the unit positive and negative voltage signals, respectively, finally achieving output of the positive and negative voltage signals. Hence, in the embodiment of the present disclosure, only one booster circuit unit 2 is adopted for each charge pump unit structure 1 while the output of the positive and negative voltage signals can be realized. Compared with the existing circuit, the embodiment of the present disclosure can reduce one booster circuit unit 2, the booster circuit unit 2 includes an inverter and a capacitor circuit, reducing one booster circuit unit 2 can reduce much circuit area, and thus, the integration of the chip can be improved and the chip cost can be reduced.

The present disclosure has been described in detail above through specific embodiments, but these are not intended to form limitations on the present disclosure. Without departing from the principles of the present disclosure, those skilled in the art can also make many variations and improvements, which should also be regarded as the protection scope of the present disclosure.

What is claimed is:

1. A charge pump circuit having a charge pump unit structure comprising:
    a booster circuit unit;
    a positive pump transfer unit; and
    a negative pump transfer unit;
    wherein an output terminal of the booster circuit unit is connected to an input terminal of the positive pump transfer unit through a first switch circuit;
    wherein the output terminal of the booster circuit unit is connected to an input terminal of the negative pump transfer unit through a second switch circuit;
    wherein a control end of the positive pump transfer unit is connected to an erase enable signal and a first enable signal; and a control end of the negative pump transfer unit is connected to the erase enable signal and a second enable signal, and the second enable signal is an inverted signal of the first enable signal;
    wherein a control terminal of the first switch circuit is connected to the first enable signal, and a control terminal of the second switch circuit is connected to the second enable signal;
    wherein when the erase enable signal is enabled, the charge pump circuit outputs both a positive voltage signal and a negative voltage signal;

wherein during an enabling process of the erase enable signal, when the first enable signal is enabled, the first switch circuit is conducted, the second switch circuit is switched off, the positive pump transfer unit works, the negative pump transfer unit stops working, the booster circuit unit provides a boost signal to the positive pump transfer unit and a positive voltage charge pump unit is composed of the booster circuit unit and the positive pump transfer unit, and the positive voltage charge pump unit works and outputs a unit positive voltage signal from an output terminal of the positive pump transfer unit;

wherein during the enabling process of the erase enable signal, when the second enable signal is enabled, the second switch circuit is conducted, the first switch circuit is switched off, the negative pump transfer unit works, the positive pump transfer unit stops working, the booster circuit unit provides a boost signal to the negative pump transfer unit, and a negative voltage charge pump unit is composed of the booster circuit unit and the negative pump transfer unit, and the negative voltage charge pump unit works and outputs a unit negative voltage signal from an output terminal of the negative pump transfer unit.

2. The charge pump circuit according to claim 1, wherein the frequency of the first enable signal is greater than the frequency of the erase enable signal, and during the enabling process of the erase enable signal, the positive voltage charge pump unit and the negative voltage charge pump unit work alternately so that the charge pump circuit outputs both a positive voltage signal and a negative voltage signal.

3. The charge pump circuit according to claim 1, wherein the erase enable signal is enabled when it is at a high level; or, the erase enable signal is enabled when it is at a low level.

4. The charge pump circuit according to claim 3, wherein the first enable signal is enabled when it is at a high level, and the second enable signal is enabled when it is at a high level; or, the first enable signal is enabled when it is at a low level, and the second enable signal is enabled when it is at a low level.

5. The charge pump circuit according to claim 1, wherein the booster circuit unit comprises an inverter and a capacitor circuit; and
wherein an input terminal of the inverter is connected to an input clock signal, an output terminal of the inverter is connected to an input terminal of the capacitor circuit, and an output terminal of the capacitor circuit serves as the output terminal of the booster circuit unit and outputs the boost signal.

6. The charge pump circuit according to claim 5, wherein the inverter is a CMOS inverter.

7. The charge pump circuit according to claim 5, wherein the capacitor circuit is formed by connecting a plurality of capacitors in series or in parallel, and the capacitor of the capacitor circuit comprises a MOS capacitor.

8. The charge pump circuit according to claim 7, wherein the MOS capacitor is composed of an NMOS transistor with a source and a drain connected together or a PMOS transistor connected with a source and a drain connected together.

9. The charge pump circuit according to claim 1, wherein the positive pump transfer unit comprises a first NMOS transistor and a second NMOS transistor;
wherein a drain of the first NMOS transistor is connected to a drain of the second NMOS transistor and connected to a first positive voltage input signal;
wherein a gate of the first NMOS transistor is connected to a gate of the second NMOS transistor and connected to a second positive voltage input signal;
wherein a source of the first NMOS transistor outputs a first positive voltage output signal, and a source of the second NMOS transistor outputs a second positive voltage output signal; and
wherein the output terminal of the booster circuit unit is connected to the drain of the first NMOS transistor.

10. The charge pump circuit according to claim 9, wherein the positive pump transfer unit also comprises a third NMOS transistor;
wherein a source of the third NMOS transistor is connected to the drain of the first NMOS transistor, a drain of the third NMOS transistor is connected to the gate of the first NMOS transistor, and a gate of the third NMOS transistor is connected to the source of the first NMOS transistor.

11. The charge pump circuit according to claim 1, wherein the negative pump transfer unit comprises a fourth NMOS transistor and a fifth NMOS transistor;
wherein a drain of the fourth NMOS transistor is connected to a drain of the fifth NMOS transistor and outputs a first negative voltage output signal;
wherein a gate of the fourth NMOS transistor is connected to gate of the fifth NMOS transistor and connected to the second negative voltage output signal;
wherein a source of the fourth NMOS transistor is connected to the first negative voltage input signal, and a source of the fifth NMOS transistor is connected to the second negative voltage input signal; and
wherein the output terminal of the boosting circuit unit is connected to the drain of the fourth NMOS transistor.

12. The charge pump circuit according to claim 11, wherein the negative pump transfer unit also comprises a sixth NMOS transistor; and
wherein a source of the sixth NMOS transistor is connected to the gate of the fourth NMOS transistor, a drain of the sixth NMOS transistor is connected to the drain of the fourth NMOS transistor, and a gate of the sixth NMOS transistor is connected to the source of the fourth NMOS transistor.

13. The charge pump circuit according to claim 1, wherein the first switch circuit comprises more than one NMOS transistor or PMOS transistor connected in series; and
wherein the second switch circuit comprises more than one NMOS transistor or PMOS transistor connected in series.

14. The charge pump circuit according to claim 1, wherein the charge pump circuit is formed by connecting the charge pump unit structure in multiple stages in series.

15. The charge pump circuit according to claim 14, wherein in the charge pump unit structure of a first stage, the input terminal of the positive voltage charge pump unit is connected to a power supply voltage, the unit positive voltage signal output by the positive voltage charge pump unit of the charge pump unit structure of each stage increases stage by stage and the positive voltage signal is outputted at the positive voltage charge pump unit of the charge pump unit structure of a last stage; and
wherein in the charge pump unit structure of the first stage, the input terminal of the negative voltage charge pump unit is grounded, the unit negative voltage signal output by the negative voltage charge pump unit of the charge pump unit structure of each stage decreases stage by stage and the negative voltage signal is outputted at the negative voltage charge pump unit of the charge pump unit structure of the last stage.

\* \* \* \* \*